United States Patent
Hammes et al.

(10) Patent No.: US 6,756,927 B2
(45) Date of Patent: Jun. 29, 2004

(54) SIGMA-DELTA PROGRAMMING DEVICE FOR A PLL FREQUENCY SYNTHESIZER, CONFIGURATION USING THE SIGMA-DELTA PROGRAMMING DEVICE, PLL FREQUENCY DEVICE, AND METHOD FOR PROGRAMMING A PROGRAMMABLE DEVICE

(75) Inventors: Markus Hammes, Dinslaken (DE); Stefan Van Waasen, Duisburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/634,525

(22) Filed: Aug. 5, 2003

(65) Prior Publication Data

US 2004/0036639 A1 Feb. 26, 2004

Related U.S. Application Data

(63) Continuation of application No. PCT/DE02/00062, filed on Jan. 10, 2002.

(30) Foreign Application Priority Data

Feb. 5, 2001 (DE) .......................................... 101 05 057

(51) Int. Cl.[7] ................................................ H03M 3/00
(52) U.S. Cl. ...................... 341/143; 331/1 A; 375/376; 332/127
(58) Field of Search ................................. 341/143, 144; 332/127, 100; 331/1 A, 23, 16, 25; 375/376, 373, 375

(56) References Cited

U.S. PATENT DOCUMENTS

| 4,694,475 A | | 9/1987 | Mehrgardt |
| 4,965,531 A | * | 10/1990 | Riley .......................... 331/1 A |
| 5,079,521 A | | 1/1992 | Gaskell et al. |
| 5,903,194 A | * | 5/1999 | Opsahl et al. ............... 331/1 A |
| 6,008,703 A | * | 12/1999 | Perrott et al. ................ 322/100 |
| 6,008,704 A | * | 12/1999 | Opsahl et al. ............... 332/127 |
| 6,044,124 A | | 3/2000 | Monahan et al. |
| 2002/0061086 A1 | * | 5/2002 | Adachi et al. ............... 375/376 |

FOREIGN PATENT DOCUMENTS

| DE | 196 40 072 A1 | 4/1998 |
| DE | 199 29 167 A1 | 12/2000 |
| EP | 0 202 347 A1 | 11/1986 |

\* cited by examiner

Primary Examiner—Brian Young
Assistant Examiner—John B. Nguyen
(74) Attorney, Agent, or Firm—Laurence A. Greenberg; Werner H. Stemer; Ralph E. Locher

(57) ABSTRACT

A sigma-delta programmer is supplied with a data word having a word length of N bits. The most significant L bits of the data word represent the places before the decimal point, and the remaining N−L less significant bits represent the places after the decimal point in the data word. A sigma-delta modulator is supplied with the N−L+1 less significant bits of the data word. An adder receives the L−1 most significant bits of the data word and a data word that is output by the sigma-delta modulator, and outputs a signal, which is multiplied by the value two by a multiplier.

10 Claims, 2 Drawing Sheets

SIGMA-DELTA PROGRAMMING DEVICE FOR A PLL FREQUENCY SYNTHESIZER, CONFIGURATION USING THE SIGMA-DELTA PROGRAMMING DEVICE, PLL FREQUENCY DEVICE, AND METHOD FOR PROGRAMMING A PROGRAMMABLE DEVICE

CROSS-REFERENCE TO RELATED APPLICATION

This application is a continuation of copending International Application No. PCT/DE02/00062, filed Jan. 10, 2002, which designated the United States and was not published in English.

BACKGROUND OF THE INVENTION

Field of the Invention

The invention relates to a sigma-delta programming device for a PLL frequency synthesizer, a configuration using the sigma-delta programming device, a PLL frequency device, and a method for programming a programmable device.

Sigma-delta modulators are known in digital technology. Due to their transfer characteristic (all-pass filter for the input signal, high-pass filter for the quantization noise), they are used in conjunction with a programmable frequency divider for direct or indirect modulation of an analog transmission signal. These technologies have a broad scope of application and are used, by way of example, in the DECT (Digital European Communications Transmission) standard or in Bluetooth systems.

Indirect modulation involves the use of a PLL (Phase Locked Loop) circuit as a modulator. PLL circuits have a high level of flexibility with regard to usable reference frequencies for a demanded frequency resolution at the output of the PLL circuit, and afford short settling times. Modulation is performed using a programmable frequency divider that is disposed in the feedback path of the PLL circuit and is actuated or programmed by a programming device on the basis of a modulation signal. Preferably, "fractional-N PLL circuits" are used. Fractional-N PLL circuits allow frequency division by N, where N does not necessarily have to be an integer ("fractional synthesis technology"). In the case of fractional synthesis technology, the interference arising upon integer division in a PLL as a result of lateral lines in the spectrum is circumvented.

Programming devices for fractional-N PLL circuits are already known that contain a sigma-delta modulator.

U.S. Pat. No. 4,965,531 to Riley describes a fractional-N PLL frequency synthesizer. Fractional frequency division is effected by a one-bit sigma-delta programmer of second or higher order that actuates a single-stage dual-modulus frequency divider or, in another exemplary embodiment, a two-stage multi-modulus frequency divider. In addition, the specification mentions that the sigma-delta programmer can also have a multi-bit output.

U.S. Pat. No. 6,008,703 to Perrott et al. specifies a further fractional-N PLL frequency synthesizer. The circuit includes a fractional frequency divider that includes a sigma-delta modulator as a programming device and a multi-modulus frequency divider in the feedback loop of the PLL circuit. The sigma-delta modulator produces a divider signal having a word length of six bits. The multi-modulus frequency divider includes a multi-modulus 4/5/6/7 divider stage having an input for two bits and four cascaded ⅔ divider stages that each have a single-bit input. This permits frequency division to be achieved that corresponds to "swallowing" a number of between 0 and 63 periods ($2\pi$) of the output signal from the voltage-controlled oscillator (pulse-swallowing principle).

German Published, Non-Prosecuted Patent Application No. DE 199 29 167 A1 describes two-point modulation using a PLL circuit. The modulation is performed firstly using a sigma-delta fractional-N frequency divider in the feedback path of the circuit and secondly by supplying the modulation signal (which has been subjected to analog conversion beforehand) at a summation point at the input of the voltage-controlled oscillator.

U.S. Pat. No. 6,044,124 to Monahan et al. describes a sigma-delta programming device for a programmable frequency divider. The sigma-delta programming device includes a unit having a sigma-delta modulator, a dither function modulator and a switch that is controlled by the output signal from the dither function modulator and delivers a control signal for the fractional component of the frequency division. An adder adds this control signal for the fractional component of the frequency division to a control signal for the integer divider component. The output signal from the adder is used to program the programmable frequency divider.

The frequency-limiting element in such a PLL circuit is the frequency divider. This applies particularly if the frequency divider is in the form of an integrated component in a pure CMOS process. In this context, it should be remembered that, in relation to frequency limiting, the use of uneven divider factors (divisors) for programming the frequency divider is far more critical than the use of even divisors. Attempts are therefore made to prevent the occurrence of uneven divisors for actuating a programmable frequency divider. To date, it is possible to produce exclusively even divisors only if the programming device for actuating the frequency divider is constructed from multi-bit sigma-delta modulators of complicated configuration that include a comparator having a plurality of decision thresholds. This requires a high level of involvement for layout and manufacture.

SUMMARY OF THE INVENTION

It is accordingly an object of the invention to provide a sigma-delta programming device for a PLL frequency synthesizer, a configuration using the sigma-delta programming device, a PLL frequency device, and a method for programming a programmable device that overcome the hereinafore-mentioned disadvantages of the heretofore-known devices of this general type and that produce, in a simple manner, only even output values (divisors) for programming a device such as a programmable frequency divider. In addition, the invention is also aimed at specifying configurations of simple construction for direct and indirect modulators.

With the foregoing and other objects in view, there is provided, in accordance with the invention, a sigma-delta programming device, including an input, a sigma-delta modulator, an adder, and a multiplier. The input is configured to receive a digital signal with a word length of N bits, most significant L bits of a data word representing places before a decimal point in a binary number represented by the data word, and remaining N–L less significant bits representing places after the decimal point in the binary number. The sigma-delta modulator is configured to receive N–L+1 less significant bits of the N-bit data word. The adder has a first adder input configured to receive the L−1 most significant bits of the N-bit data word, a second adder input being configured to receive a signal processed by the sigma-delta modulator, and an output. The multiplier is configured to multiply the output of the adder by two.

The fact that the sigma-delta modulator is supplied not only with the N−L less significant bits that represent the places after the decimal point in the data word in the modulation signal but also with the bit in the least significant place in front of the decimal point in this data word means that rightward shifting of the integer component of the data word by one binary place and hence multiplication thereof by the factor 0.5 are achieved. On account of the one additional place, the resolution of the sigma-delta modulator needs to be one bit greater than in the case of a sigma-delta modulator based on a conventional implementation. Following addition of the data word's integer component shifted one place to the right (and shortened by its least significant bit) to the output of the sigma-delta modulator in the adder, it is multiplied by the value 2. This converts the data word back to the correct value range and also ensures that the divisor delivered at the output of the multiplier is always an even integer.

Preferably, the sigma-delta modulator is a sigma-delta modulator that is constructed exclusively from single-bit decision makers (a comparator having just one decision threshold). This achieves minimal layout and implementation involvement for the sigma-delta programming device.

One preferred application of the inventive sigma-delta programming device is to use it to actuate a programmable frequency divider that is situated in the feedback loop of a PLL circuit. This ensures that even-numbered divisor values (the output values from the sigma-delta programming device) are used for fractional frequency division at all times. The additional involvement required for this purpose in line with the invention (sigma-delta modulator with one bit higher resolution, additional multiplier) is low.

Other features that are considered as characteristic for the invention are set forth in the appended claims.

Although the invention is illustrated and described herein as embodied in a sigma-delta programming device for a PLL frequency synthesizer, a configuration using the sigma-delta programming device, a PLL frequency device, and a method for programming a programmable device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
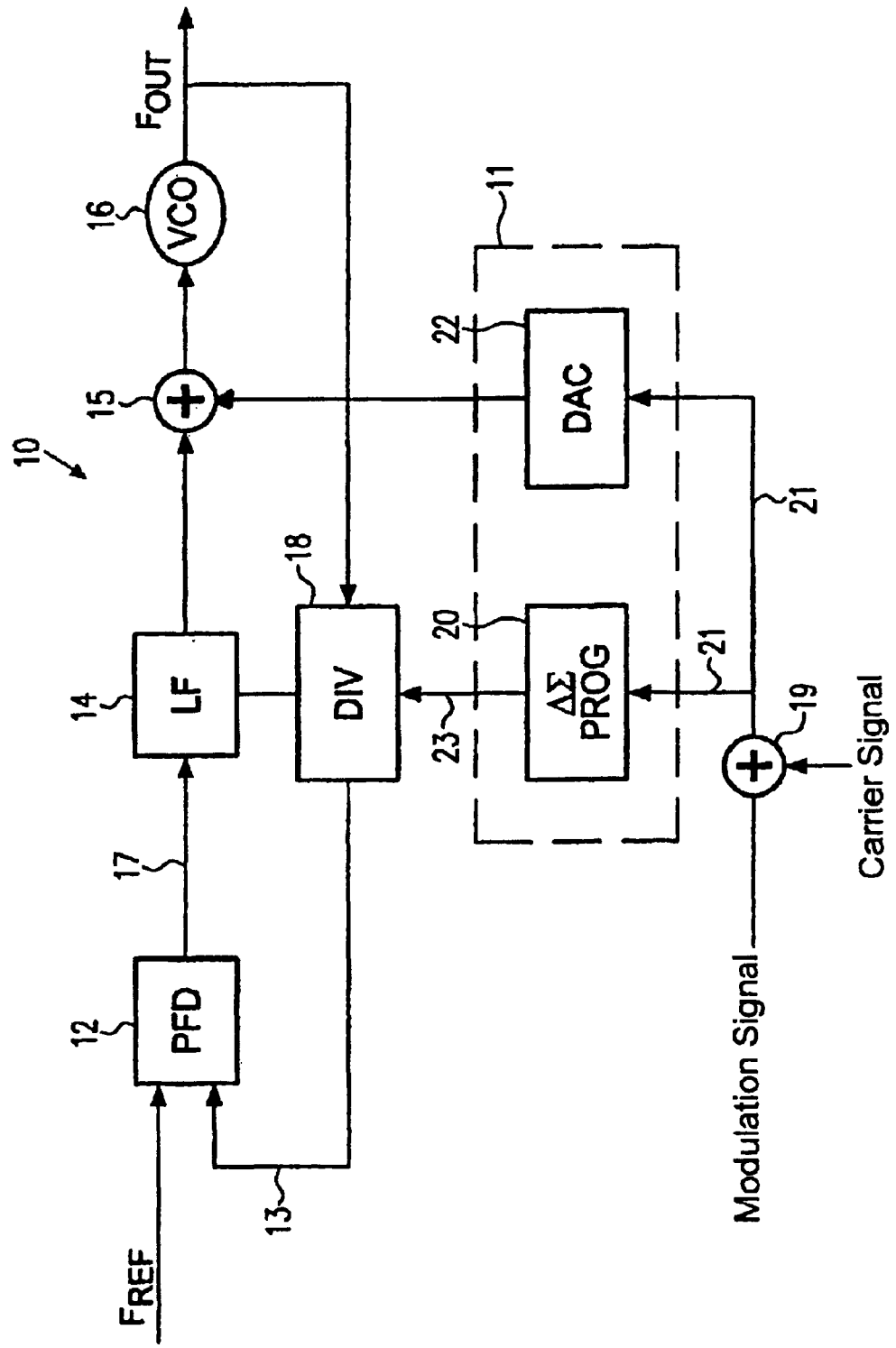
FIG. 1 is a schematic and block circuit diagram showing a fractional-N PLL circuit in accordance with the invention.

Referring now to the figures of the drawings in detail and first, particularly to FIG. 1 thereof, there is shown a frequency synthesizer that is used to produce an output signal having a frequency $F_{OUT}$, from an input signal or reference signal having the frequency $F_{REF}$. The output signal having the frequency $F_{OUT}$ can be modulated by a digital modulation signal.

The frequency synthesizer includes a PLL circuit 10 and a circuit 11 that is coupled to the PLL circuit 10 at suitable points and is used to modulate the output signal from the PLL circuit 10.

The PLL circuit 10 has a phase detector PFD (Phase-Frequency-Detector) 12 to which the reference signal having the fixed frequency $F_{REF}$ and also a fed-back frequency divider signal 13 are supplied. The reference signal is derived from a quartz oscillator, for example. The phase detector 12 compares the phases of the two frequencies obtained and produces a control signal 17 that corresponds to the phase difference between the two signals obtained. The control signal 17 is supplied to a loop filter LF 14 that is a low-pass filter and smoothes the control signal 17. The output of the loop filter 14 passes through an optional summation point 15 (provided only in the case of two-point modulation) and is supplied to a voltage-controlled oscillator VCO 16. The output of the voltage-controlled oscillator 16 firstly delivers the output signal from the PLL circuit 10 and is secondly fed back to the frequency detector 12 as a frequency divider signal 13 via a programmable frequency divider DIV 18. The programmable frequency divider 18 is normally in the form of a multi-modulus frequency divider.

The action of the PLL control loop 10 is such that the frequency $F_{OUT}$ of the output signal from the control loop 10 in the state of equilibrium corresponds exactly to the reference-frequency $F_{REF}$ multiple stipulated by the frequency divider 18.

The carrier signal on which the PLL frequency synthesis is based and also the digital modulation signal for carrier modulation are supplied to the PLL circuit 10 via the circuit 11 and the programmable frequency divider 18 in a known manner. For this purpose, the digital modulation signal is added to the carrier signal via a summation point 19. The resultant modulated carrier signal 21 is supplied to a sigma-delta programmer (ΔΣ PROG) 20 in the form of a series of successive frequency words. The sigma-delta programmer 20 produces a divisor control signal 23 for the programmable frequency divider 18. The divisor control signal 23 includes a series of data words. Each data word represents an integer. Upon receiving each data word, the frequency divider 18 is programmed such that it multiplies the frequency $F_{OUT}$ obtained by the reciprocal of the integer.

Introducing the modulation into the PLL circuit 10 via the programmable frequency divider 18 assesses the modulation signal using a low-pass function. This restricts the modulation bandwidth generally to bandwidth values that are smaller than the PLL bandwidth. To achieve a mostly frequency-independent transfer response for the PLL circuit 10, two-point modulation technology is optionally used. This technology involves the modulated carrier signal 21 being supplied to a digital-analog converter DAC 22. The DAC 22 converts the modulated carrier signal 21 into an analog signal that is supplied to the PLL circuit 10 at a point having a high-pass characteristic.

Figure 2:
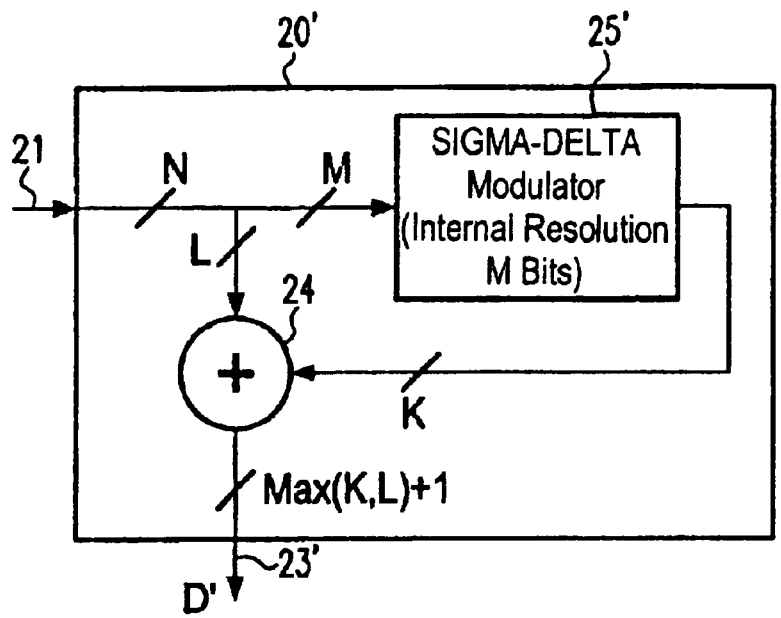
FIG. 2 is a circuit diagram showing a sigma-delta programming device according to the prior art.

The use of a sigma-delta programming device for actuating a multi-modulus frequency divider is known in the prior art, for example, see U.S. Pat. No. 6,044,124, mentioned in the introduction. The use of a sigma-delta modulator in the programming device allows very fine quantization stages to be achieved for the introduced phase of the modulated carrier signal 21. FIG. 2 illustrates the configuration of a known sigma-delta programmer 20'. The input side 21 of the prior-art sigma-delta programmer 20' is supplied with a frequency word that has a word length of N bits. In the programmer 20', the rational component (M bits) of the N-bit frequency word is now supplied to a sigma-delta modulator 25'. The M bits represent the places after the decimal point in the frequency word, i.e. are associated with the significances $2^{-1}, 2^{-2}, 2^{-3}, \ldots$ etc. The places before the decimal point, that is to say the integer component of the frequency word, include the remaining L=N−M bits. This integer component is separated from the N-bit frequency word and is supplied to an adder 24. The other input of the adder 24 is fed by the output of the sigma-delta modulator 25'. The sigma-delta modulator 25' has an internal resolution of M bits and outputs an output signal having a word length of K bits. The K-bit binary word represents an integer.

The adder 24 calculates an integer D' from the bit words obtained. On account of the addition, the word length of the output signal from the adder 24 is increased to Max(K,L)+1. The addition can generally produce both even and uneven integers D' as a result. The result of this is that the programmable frequency divider 18, which is actuated by the output signal 23' from the adder 24 and is reprogrammed in constant repetition, performs frequency division using an even or an uneven divisor D'.

Figure 3:
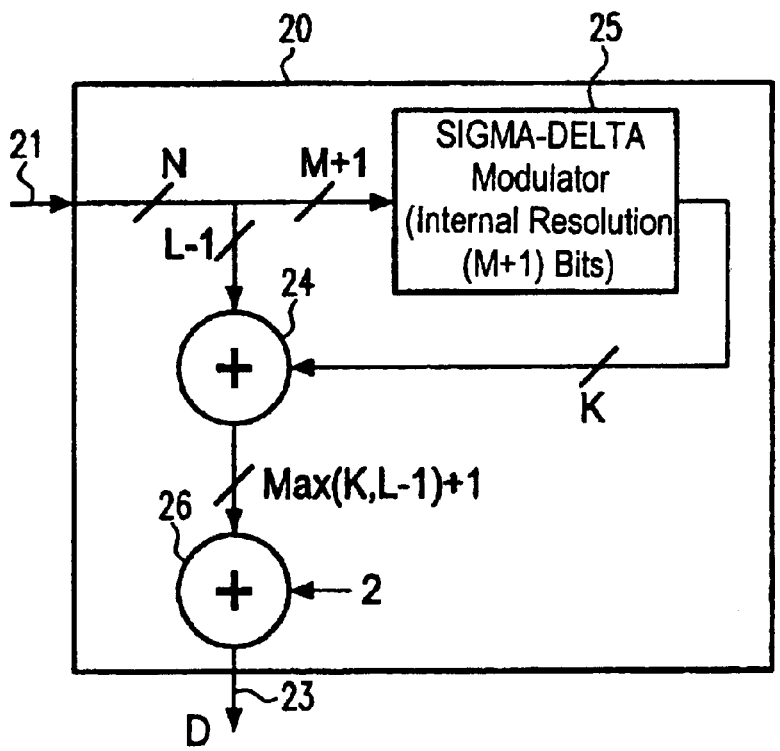
FIG. 3 is a circuit diagram showing a sigma-delta programming device according to the invention.

FIG. 3 shows the configuration of a sigma-delta programmer 20 in accordance with the invention. The same or comparable functional elements as in FIG. 2 are identified by the same references. The inventive sigma-delta programmer 20 is likewise a digital multi-bit programmer. In a similar manner to the prior art, this is supplied with the modulated carrier signal 21 in the form of a series of N-bit frequency words. The fundamental difference from the prior art (FIG. 2) is now that the sigma-delta modulator 25 processes one bit more than the rational component of the frequency word. In other words, the N-bit frequency word is broken down into a first component including the L−1 more significant bits and a second component including the remaining M+1 less significant bits. The sigma-delta modulator 25, which has an internal resolution of M+1 bits, is supplied with that component of the frequency word that includes the less significant M+1 bits. This component is subjected to sigma-delta modulation. The more significant (L−1)-bit component is supplied to the adder 24, with the less significant bit of this component, which has the significance $2^1$, being supplied to the adder input having the significance $2^0$, the bit having the significance $2^2$ being supplied to the adder input having the significance $2^1$, etc. This corresponds to dividing the integer component of the frequency word by the value 2 and —if the result obtained in the process is not an integer (i.e. the integer component of the frequency word is an uneven number)—to rounding down to the next smallest integer.

By adding the bit word obtained in this manner to the output of the sigma-delta modulator 25 (word length K), an integer bit word having the word length Max(K,L−1)+1 is obtained. To achieve a depiction in the correct value range, that is to say to reverse the division by the value 2, this bit word is supplied to a multiplier 26. The multiplier multiplies by the factor 2, that is to say shifts the bit word obtained from the adder 24 one binary place to the left. The divisor control signal available at the output of the multiplier 26 thus always has even-numbered values D. As already mentioned, these are used as divisors in the programmable frequency divider 18.

A particular advantage of the inventive sigma-delta programmer 20 is that it can very easily be developed from the conventional sigma-delta programmer 20'. The entire peripheral area for producing the modulated carrier signal 21 (frequency input word) and also the architecture of the sigma-delta programmer used remain unchanged. It is merely necessary to extend the resolution of the sigma-delta modulator 25 by one bit and to add a multiplier 26 to the output of the conventional sigma-delta programmer 20'.

The inventive practice worsens the noise in the PLL circuit 10 by 6 dB. The reason for this is that the unchanged order and reference frequency mean that the noise in the inventive sigma-delta programmer 20 as compared with the prior-art sigma-delta programmer 20' remains unchanged up to the multiplication by the factor 2 (multiplier 26). The multiplication then shifts the whole spectrum by 6 dB, so that the filtering in the closed PLL control loop 10 from the supply point for the divisor D on the programmable frequency divider 18 to the output of the voltage-controlled oscillator 16 also increases the noise by 6 dB. This increased noise can be compensated for at least in part by reducing the bandwidth of the PLL circuit 10 using the loop filter 14. The resultant increase in the settling time is not critical for a sigma-delta fractional PLL in systems such as Bluetooth.

As already mentioned, the sigma-delta programmer 20 and the programmable frequency divider 18 interact in the form of a fractional frequency divider. The effect achieved by this is that, during frequency synthesis, the quotient $F_{OUT}/F_{REF}$ can be set to a non-integer, even though the numbers used for programming are integers. The principle of fractional frequency division is known. It is based on dynamically changing the (integer, in accordance with the invention also even-numbered) divisor values D over time. The number supplied to the adder 24 by the (L−1)-bit component of the frequency word is denoted by D1, and the number supplied to the adder 24 by the sigma-delta modulator 25 is denoted by D2. While the summand D1 remains constant over a sampling period and prescribes the integer component of the fractional division, the summand D2 is processed by using the sigma-delta modulation using oversampling and is therefore constantly changed. The mean of the values of D2 then prescribes the fractional component of the frequency division.

The inventive sigma-delta programmer 20 can also be used for direct modulation. Direct modulation differs from the indirect modulation explained with reference to FIG. 1 primarily in that the PLL circuit 10 is dispensed with. That is, the supply point provided by the programmable frequency divider 18 is not in a feedback loop in the case of direct modulation but rather directly in the signal path for the reference frequency that is to be modulated.

We claim:
1. A sigma-delta programming device, comprising:
an input being configured to receive a digital signal with a word length of N bits, most significant L bits of a data word representing places before a decimal point in a binary number represented by the data word, and remaining N−L less significant bits representing places after the decimal point in the binary number;
a sigma-delta modulator being configured to receive N−L+1 less significant bits of the N-bit data word;
an adder having a first adder input configured to receive L−1 most significant bits of the N-bit data word, a second adder input being configured to receive a signal processed by said sigma-delta modulator, and an output; and
a multiplier configured to multiply a signal from said output of said adder by two.

2. The sigma-delta programming device according to claim 1, wherein said adder adds the L−1 most significant bits of the N-bit data word to the signal processed by said sigma-delta modulator to produce a sum and outputs the sum at said output.

3. The sigma-delta programming device according to claim 1, wherein said sigma-delta modulator is constructed exclusively from single-bit decision makers.

4. A configuration, comprising:
   a sigma-delta programming device according to claim 1; and
   a programmable frequency divider actuated by said sigma-delta programming device.

5. A PLL frequency synthesizer, comprising:
   a sigma-delta programming device according to claim 1; and
   a PLL circuit having:
      a voltage-controlled oscillator having an output configured to output a modulated output signal,
      a phase detector configured to ascertain a phase difference by subtracting a reference signal from a feedback signal derived from the output signal and to actuate said voltage-controlled oscillator based on the ascertained phase difference, and
      a feedback loop providing the feedback signal and including a programmable frequency divider controlled by said sigma-delta programming device.

6. The PLL frequency synthesizer according to claim 5, wherein the modulated output signal is a phase-modulated output signal.

7. The PLL frequency synthesizer according to claim 5, wherein the modulated output signal is a frequency-modulated output signal.

8. The PLL frequency synthesizer according to claim 5, further comprising a D/A converter configured to receive the digital signal and having an output connected to a point in said PLL circuit having a high-pass transfer response into said PLL circuit.

9. A method for programming a programmable device using a sigma-delta programming device, which comprises the steps:
   inputting a digital signal having a word length of N bits into the sigma-delta programming device, most significant L bits of a data word in the digital signal representing places before a decimal point in a binary number represented by the data word, and remaining N−L less significant bits representing places after the decimal point in the binary number;
   subjecting N−L+1 less significant bits of the N-bit data word to sigma-delta modulation to yield a sigma-delta modulated signal;
   adding the L−1 most significant bits of the N-bit data word to a data word in the sigma-delta modulated signal;
   multiplying the data word obtained from the addition by two to yield a further data word; and
   programming the programmable device using the further data word obtained from the multiplication.

10. The method according to claim 9, wherein the programmable device is a frequency divider.

* * * * *